(12) United States Patent
Groeneveld et al.

(10) Patent No.: US 6,730,920 B2
(45) Date of Patent: May 4, 2004

(54) ABBE ARM CALIBRATION SYSTEM FOR USE IN LITHOGRAPHIC APPARATUS

(75) Inventors: Rogier H. M. Groeneveld, Eindhoven (NL); Erik R. Loopstra, Heeze (NL); Jacobus Burghoom, Haelen (NL); Leon M. Levasier, Hedel (NL); Alexander Straaijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 171 days.

(21) Appl. No.: 09/758,172

(22) Filed: Jan. 12, 2001

(65) Prior Publication Data

US 2001/0008273 A1 Jul. 19, 2001

(30) Foreign Application Priority Data

Jan. 14, 2000 (EP) .............................................. 00300246

(51) Int. Cl.[7] ........................ G03B 27/52; G03B 27/42; G01B 11/00; G06K 7/015
(52) U.S. Cl. .................... 250/491.1; 250/548; 250/557; 250/561; 356/399; 356/400; 356/401
(58) Field of Search ............................. 250/491.1, 548, 250/557, 561, 492.1, 492.2, 310, 492.22; 356/399, 400, 401; 365/500, 300, 363, 400; 430/30, 296, 942

(56) References Cited

U.S. PATENT DOCUMENTS

| | | | | |
|---|---|---|---|---|
| 5,003,342 A | * | 3/1991 | Nishi ........................... | 355/43 |
| 5,053,628 A | * | 10/1991 | Yamamoto et al. .......... | 250/557 |
| 5,801,832 A | * | 9/1998 | Van Den Brink ........... | 356/500 |
| 5,831,739 A | * | 11/1998 | Ota ............................ | 356/401 |
| 5,859,707 A | * | 1/1999 | Nakagawa et al. ......... | 356/401 |
| 5,917,604 A | * | 6/1999 | Dirksen et al. ............. | 356/401 |
| 6,320,658 B1 | * | 11/2001 | Mizutani ..................... | 356/399 |
| 6,331,885 B1 | * | 12/2001 | Nishi ........................... | 355/53 |
| 6,414,743 B1 | * | 7/2002 | Nishi et al. .................. | 355/69 |
| 2001/0043321 A1 | * | 11/2001 | Nishi et al. .................. | 355/67 |
| 2002/0018192 A1 | * | 2/2002 | Nishi ........................... | 355/53 |
| 2002/0039694 A1 | * | 4/2002 | Scheiberlich et al. ........ | 430/30 |

FOREIGN PATENT DOCUMENTS

| | | | | |
|---|---|---|---|---|
| JP | 09199573 A | * | 7/1997 | ........... H01L/21/68 |
| JP | 2001244194 A | * | 9/2001 | ......... H01L/21/027 |

\* cited by examiner

Primary Examiner—John R. Lee
Assistant Examiner—Bernard E Souw
(74) Attorney, Agent, or Firm—Pillsbury Winthrop LLP (57) ABSTRACT

In a lithographic apparatus, a reference grating 11 mounted on the wafer table WT is illuminated with a measurement beam 20 incident in a direction independent of wafer table tilt. The diffraction orders are detected by detector 30 and used to determine the lateral shift in the wafer table resulting from a non-zero Abbe arm, and hence the Abbe arm, for calibration purposes. The detector 30 may be a detector also used for off-axis alignment of the wafer and wafer table.

20 Claims, 4 Drawing Sheets

ABBE ARM CALIBRATION SYSTEM FOR USE IN LITHOGRAPHIC APPARATUS

BACKGROUND OF THE INVENTION

1. Field of the Invention

The present invention relates to the calibration of the Abbe arm in lithographic apparatus. More particularly, the invention relates to a system for calibration of the Abbe arm in lithographic projection apparatus comprising:

an illumination system for supplying a projection beam of radiation;

a first object table for holding patterning means capable of patterning the projection beam according to a desired pattern;

a second object table for holding a substrate;

a projection system for imaging the patterned beam onto a target portion of the substrate; and a positioning system for moving said second object table between an exposure position, at which said projection system can image said mask portion onto said substrate, and a measurement position.

2. Description of the Related Art

The term "patterning means" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning means include:

A mask held by said first object table. The concept of a mask is well known in lithography, and its includes mask types such as binary, alternating phase-shift, and attenuated phase-shift, as well as various hybrid mask types. Placement of such a mask in the projection beam causes selective transmission (in the case of a transmissive mask) or reflection (in the case of a reflective mask) of the radiation impinging on the mask, according to the pattern on the mask. The first object table ensures that the mask can be held at a desired position in the incoming projection beam, and that it can be moved relative to the beam if so desired.

A programmable mirror array held by a structure, which is referred to as first object table. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array held by a structure, which is referred to as first object table. An example of such a construction is given in U.S. Pat. No. 5,229,872, which is incorporated herein by reference.

For purposes of simplicity, the rest of this text may, at certain locations, specifically direct itself to examples involving a mask; however, the general principles discussed in such instances should be seen in the broader context of the patterning means as hereabove set forth.

The projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the projection beam of radiation, and such components may also be referred to below, collectively or singularly, as a "lens". In addition, the first and second object tables may be referred to as the "mask table" and the "substrate table", respectively.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In general, apparatus of this type contained a single first object (mask) table and a single second object (substrate) table. However, machines are becoming available in which there are at least two independently movable substrate tables; see, for example, the multi-stage apparatus described in U.S. Pat. No. 5,969,441 and U.S. application Ser. No. 09/180,011, filed Feb. 27, 1998 (WO 98/40791), incorporated herein by reference. The basic operating principle behind such a multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to the exposure position underneath the projection system as soon as exposure of the first substrate is completed, whence the cycle repeats itself; in this manner, it is possible to achieve a substantially increased machine throughout, which in turn improves the cost of ownership of the machine.

The measurement performed on the substrate at the measurement position may, for example, include a determination of the spatial relationship (in X & Y directions) between various contemplated target areas on the substrate (die, areas) and a reference marker (e.g. fiducial) located on the second object table outside the area of the substrate. Such information can subsequently be employed at the exposure position to perform a fast and accurate leveling of the target areas with respect to the projection beam; for more information see WO 99/32940 (P-0079), for example. This document also describes the preparation at the measurement position of a height map relating the Z position of the substrate surface at an array of points to a reference plane of the second object table. However the reference plane is defined by a Z-interferometer at the measurement position and a different Z-interferometer is used at the at the exposure position. It IS therefore necessary to know accurately the relationship between the two Z-interferometers.

The so-called Abbe arms AAx, AAy in a lithograph device are the distances between the surface of the substrate, when mounted on the second object table, and the axes of rotation of the second object table in Rx and Ry. (In this document, $R_1$ denotes rotation about an axis parallel to the I-direction in an orthogonal XYZ system, where the XY plane is parallel to the substrate surface at zero tilt.) These axes are fictitious and determined by software since, in general, the tilt of the second object table about the X and Y-axes is controlled by spaced-apart Z actuators rather than by rotating it about physical pivots.

Figure 2:
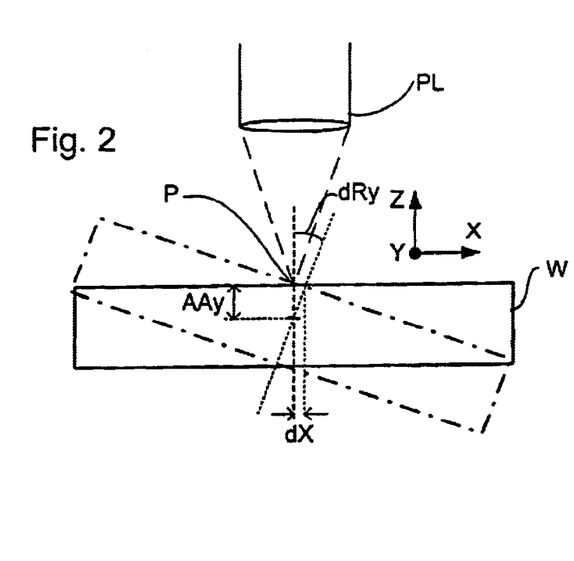
FIG. 2 is a view illustrating the effect of a non-zero Abbe arm.

The effect of a non-zero Abbe arm in the exposure position is illustrated in FIG. 2 of the accompanying drawings. As can there be seen, if the Abbe arm AAy, for example, is non-zero, rotation of the substrate W about the Y axis by an amount dRy causes a shift in the central focal point P of the projection lens system PL on the substrate by an amount dX. Correspondingly, rotation dRx causes a shift dY. For small angles of rotation the following equations hold:

$$dX = dRy \cdot AAy \quad [1]$$

$$dY = dRx \cdot AAx \quad [2]$$

The Abbe arms, AAx, AAy, may also conveniently be expressed in the form (Zw-Za), where Zw is the height of the surface of the substrate in the reference system of the apparatus and Za is the height of the relevant axis of rotation in that system.

Since the rotation-invariant point of the second object table is determined by software, referring to an interferometer system which measures the position of the second object table, it may be thought that there is no difficulty in setting the Abbe arm to zero. However, the high precision requirements on the Abbe arm and the irregularities that exist between interferometer systems make it necessary to calibrate the Abbe arm with very high accuracy on initial set-up. It can be necessary to repeat the calibration after set-up because of the occurrence of drift.

A known method of determining the Abbe arms at the exposure position for calibration purposes is to expose a substrate with a series of reference marks at various tilts of the second object table. After development of the substrate, measurement of the translation of the marks in X and Y for the different tilts enables the Abbe arms to be determined. Since the Abbe arm is effectively dependent on the interferometer system, calibrations have to be done at both the measurement and the exposure positions. However, the known method cannot be used at the measurement position as no exposure device is available there. The need to develop a substrate is also time consuming.

SUMMARY OF THE INVENTION

An object of the present invention is to provide a system for calibrating the Abbe arm in a lithographic projection apparatus that avoids or alleviates the disadvantages of the prior art.

According to the present invention there is provided a lithographic projection apparatus comprising:

an illumination system for supplying a projection beam of radiation;

a first object table for holding patterning means capable of patterning the projection beam according to a desired pattern;

a second object table for holding a substrate having a surface to be exposed, such that, when held on the table, the said surface lies in a reference plane;

a projection system for imaging the patterned beam onto a target portion of the substrate; and a positioning system for moving said second object table between an exposure position, at which said projection system can image said patterned beam onto said substrate, and a measurement position; characterized by:

a calibration system for measuring lateral displacements of a reference point in a plane of said second object table as a function of tilt, at said measurement position, wherein said calibration system comprises:

a diffraction grating mounted to said second object table;

illuminating means for generating a measurement beam of radiation and directing it to be incident on said diffraction grating so as to be diffracted thereby; and a detector for detecting the position of said diffraction grating.

By using a calibration system for measuring lateral displacements of a reference point in a plane of said second object table as a function of tilt, it is possible to measure the Abbe arm at the measurement position. Once the Abbe arm is measured it is possible to calibrate the Abbe arm to a predetermined vertical distance from the reference plane of the second object table. Advantageously this predetermined vertical distance is set to zero, such that no lateral displacement of a reference point in said reference plane will occur with tilt of the second object table.

Preferably, said diffraction grating is an at least partially transmissive diffraction grating and said calibration system comprises a light guide for directing said measurement beam to be incident on said diffraction grating in a direction substantially independent of the tilt of said second object table.

By use of a measurement beam having an angle of incidence independent of second object table tilt, the lateral shift of a reference grating with non-zero Abbe arm can be measured independently of, or separated from, the tilt dependence of the diffracted beams from the reference grating. This is necessary because, during set-up, a detector used to measure the position of the diffraction grating is not focused and therefore the measurement of the position of the grating will show a dependency on the angle of the diffracted beams. By using a measurement beam having an angle of incidence independent of second object table tilt, this problem is circumvented.

According to a further aspect of the present invention, there is provided a method of calibrating a lithographic projection apparatus comprising:

an illumination system for supplying a projection beam of radiation;

a first object table for holding patterning means capable of patterning the projection beam according to a desired pattern;

a second object table for holding a substrate having a surface to be exposed, such that, when held on the table, the said surface lies in a reference plane;

a projection system for imaging the patterned beam onto a target portion of the substrate; and a positioning system for moving said second object table between an exposure position, at which said projection system can image said patterned beam onto said substrate, and a measurement position, said positioning system including electronic control means having parameters defining a rotation-invariant point of the second object table; the method comprising the steps of:

measuring the position of a reference point on the surface of the second object table at different tilts;

calculating the distance between the surface of the second object table and a rotation-invariant point of the second object table;

adjusting parameters of said electronic control means included in said positioning system so that said rotation-invariant point is at a predetermined vertical distance from the reference surface of the second object table.

According to a further aspect of the present invention there is provided a method of manufacturing a device using a lithographic projection apparatus comprising:

an illumination system for supplying a projection beam of radiation;

a first object table for holding patterning means capable of patterning the projection beam according to a desired pattern;

a second object table for holding a substrate having a surface to be exposed, such that, when held on the table, the said surface lies in a reference plane;

a projection system for imaging the patterned beam onto a target portion of the substrate; the method comprising the steps of:

providing a substrate provided with a radiation-sensitive later to said second object table;

providing a projection beam of radiation using the illumination system;

using said patterning means to endow the projection beam with a pattern in its cross section; and moving the second object table to an exposure position, and projecting the patterned beam of radiation onto said target portions of the substrate; characterized by the step of:

detecting displacements of a reference point of said second object table at various angles of tilt when situated at said measurement position.

In a manufacturing process using a lithographic projection apparatus according to the invention a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference mall be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative application any use of the terms "reticle", "wafer" or "die" in this text should be considered as being replaced by the more general terms "mask", "substrate" and "target area", respectively.

In the present document, the terms "radiation" and "beam" are used to encompass all types of electromagnetic radiation or particle flux, including, but not limited to, ultraviolet radiation (e.g. at a wavelength of 365 nm, 248 nm, 193 nm, 157 nm or 126 nm), EUV, X-rays, electrons and ions.

BRIEF DESCRIPTION OF THE DRAWINGS

The present invention will be described below with reference to exemplary embodiments and the accompanying schematic drawings, in which.

In the drawings, like references indicate like parts.

DETAILED DESCRIPTION OF THE INVENTION

Embodiment 1

Figure 1:
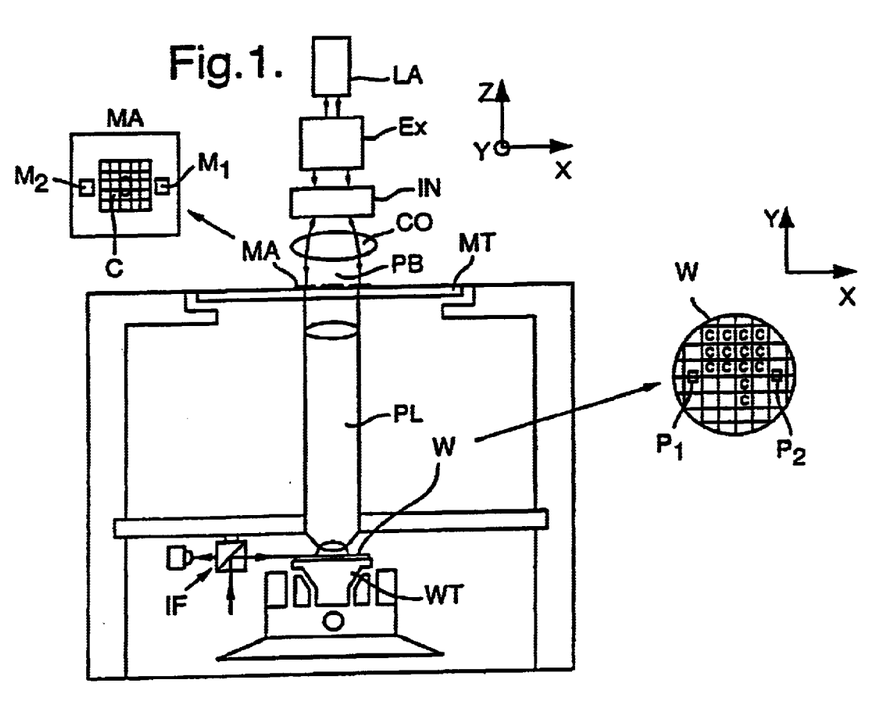
FIG. 1 depicts a lithographic projection apparatus according to a first embodiment of the invention.

FIG. 1 schematically depicts a lithographic projection apparatus according to the invention. The apparatus comprises:

a radiation system LA, Ex, IN, CO for supplying a projection beam PB of radiation (e.g. UV or EUV radiation);

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C (die) of the substrate W.

As here depicted, the apparatus is of a transmissive type (i.e. has a transmissive mask). However, in general, it may also be of a reflective type, for example.

The radiation system comprises a source LA (e.g. a Hg lamp, excimer laser, an undulator provided around the path of an electron beam in a storage ring or synchrotron, or an electron or ion beam source) which produces a beam of radiation. This beam is passed along various optical components comprised in the illumination system,—e.g. beam shaping optics Ex, an integrator IN and a condenser CO—so that the resultant beam PB has a desired shape and intensity distribution in its cross-section.

The beam PB subsequently intercepts the mask MA which is held in a mask holder on a mask table MT. Having passed through the mask MA, the beam PB passes through the lens PL, which focuses the beam PB onto a target area C of the substrate W. With the aid of the interferometric displacement measuring means IF, the substrate table WT can be moved accurately, e.g. so as to position different target areas C in the path of the beam PB. Similarly, the first positioning means can be used to accurately position the mask MA with respect to the path of the beam PB, e.g. after mechanical retrieval of the mask MA from a mask library. In general, movement of the object tables MT, WT will be realized with the aid of a long stroke module (coarse positioning) and a short stroke module (fine positioning), which are not explicitly depicted in FIG. 1.

The depicted apparatus can be used in two different modes:
1. In step mode, the mask table MT is kept essentially stationary, and an entire mask image is projected at once (i.e. a single "flash") onto a target area C. The substrate WT is then shifted in the x and/or y directions so that a different target area C can be irradiated by the beam PB;
2. In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=mV, in which M is the magnification of the lens PL (typically, M=¼ or ⅕). In this manner, a relatively large target area C can be exposed, without having to compromise on resolution.

Figures 3, 4:
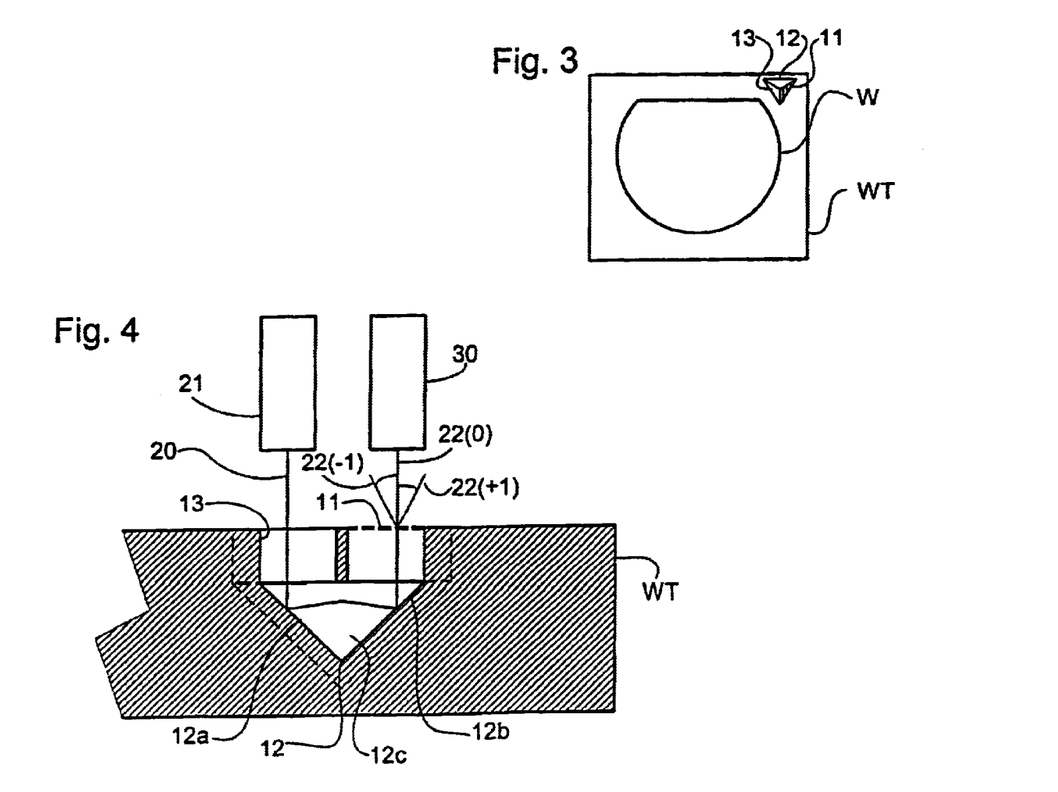
FIG. 3 is a plan view of the wafer (substrate) table of the embodiment of FIG. 1.
FIG. 4 is a side view of an Abbe arm measurement device according to the first embodiment of the invention.

As shown in FIG. 3, the second object (wafer) table WT of the present invention is provided with a reference grating, referred to as Abbe reference grating 11, on its upper surface in an area outside the area covered by wafer W. Abbe reference grating 11 is set at a known position on the wafer table relative to the wafer, and in particular at a known height relative to the upper surface of the wafer. The latter can be determined by a height sensor (not shown) of known tape. Behind (i.e. under) Abbe reference grating 11, a light guide 12 is provided. As shown in FIG. 4, light guide 12 receives measurement beam 20 emitted by light source (illumination means) 21 through entrance 13 and reflects it three times so that it returns through the Abbe reference grating 11 along a path parallel to its direction of incidence. Any suitable type of alignment grating may be used as the Abbe reference grating. It is important that light guide 12 is arranged so that the return path of measurement beam 20 is parallel to its incident path, irrespective of any (small) tilt of the wafer table relative to light source 21. In the present embodiment, light guide 12 is constituted by a corner cube with three mutually perpendicular end faces 12a, 12b, 12c at which the measurement beam undergoes reflection. Coatings may be applied to these faces to enhance reflection of the beam.

The returning measurement beam 20 is diffracted by Abbe reference grating 11 and diffraction orders 22(0), 22(−1), 22(+1), etc are generated. All or selected ones of the diffracted orders may be used by detector 30 to determine the shift of the Abbe diffraction grating 11 (at a given tilt). The shift of the Abbe reference grating 11 can be measured for several different tilts of the wafer table to determine the Abbe arm, and the relevant parameters of the table position control software adjusted until no shift is observed with tilt, indicating zero Abbe arm.

Figure 5:
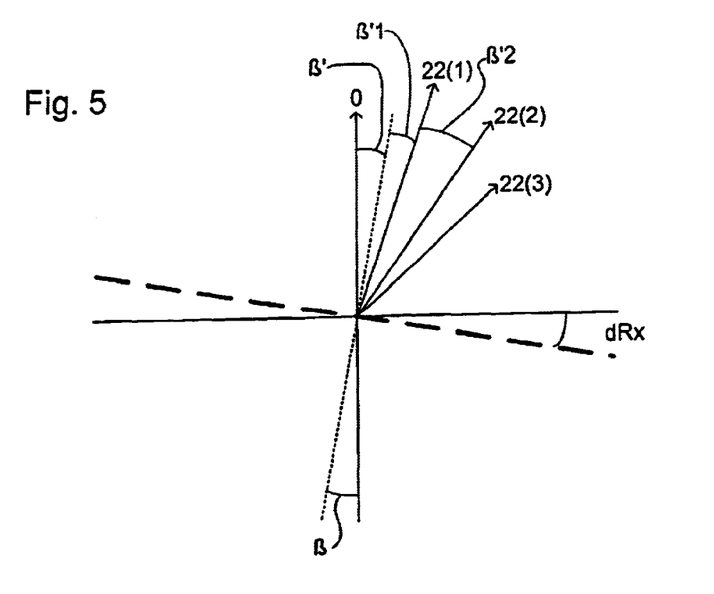
FIG. 5 is a view illustrating the effect of tilt on the angles of diffraction of the diffraction orders of a transmission diffraction grating.

FIG. 5 illustrates the effect of wafer table tilt on the diffracted orders. According to the grating equation:

$$\sin\beta_m + \sin\beta'_m = m\lambda/d \qquad [3]$$

where $\beta$ is the angle of incidence, $\beta'$ is the angle of the diffracted beam and m is the diffraction order. By setting m=0 it will be immediately seen that the zeroth order beam is not affected by tilt; however the higher orders are, and to an increasing extent. All orders are affected by the lateral shift in the Abbe reference grating due to a non-zero Abbe arm.

Figure 6:
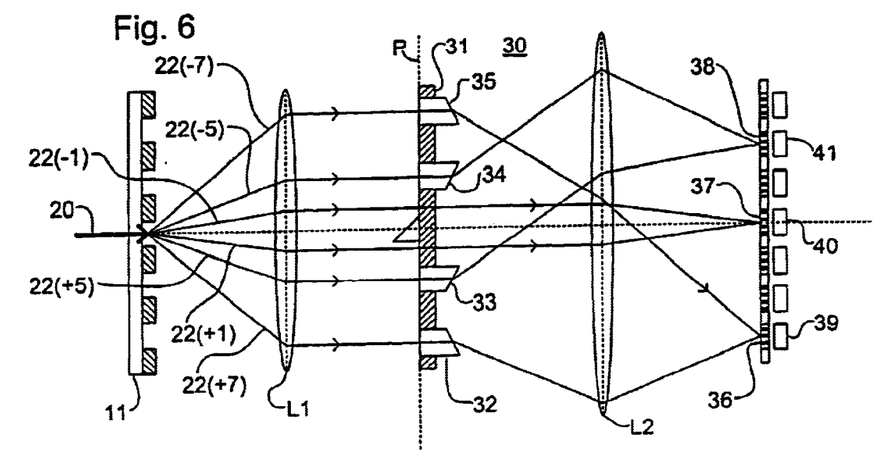
FIG. 6 is a view of an alignment sensor used in the first embodiment of the invention to measure the positions of a diffraction grating.

A suitable form of detector 30 (see FIG. 4) is illustrated in FIG. 6. This detector is primarily designed for accurate measurement of the position of wafer and wafer table reference marks in an off-axis alignment unit, but is advantageously also used for the present invention. The detector is described in greater detail in WO 98/39689; only a summary of its functioning is included herein.

The diffracted orders 22 from the Abbe reference grating 11 are captured by a first lens system L1. For the sake of clarity only diffraction orders 22(−7), 22(−5), 22(−1), 22(+1), 22(+5) and 22(+7) are shown, though all the orders, bar the zeroth, may be used in practice. The zeroth order is not used in the application for which the present detector was designed; the space is instead used for a small corner prism used to direct a frontal illumination beam onto the grating whose position is to be measured. In a detector specifically adapted for Abbe calibration, the zeroth order may indeed be used. Similarly, the lens-system L1 is depicted as a single condensing lens but in practice may be a more complex lens system.

The different diffraction orders 22 on leaving the Abbe reference grating 11 have respective different positions in angle, determined by the grating formula. Lens system L1 collimates the different beams and converts their respective angles into different positions in a plane P, so that the different orders are separated in that plane. An order diaphragm 31 is arranged in this plane. Order diaphragm 31, rather than simply blocking selected orders, includes optical wedges 32, 33, 34, 35 in at least some order apertures to impart a predetermined deflection to the respective order beams. The order beams are then focused on fixed reference gratings 36, 37, 38 behind which are situated respective photo-detectors 39, 40, 41. The optical wedges are arranged such that corresponding odd and even orders are brought together on the same one of the fixed reference gratings 36, 37, 38. For example, both seventh orders 22(+7), 22(−7) are brought together onto reference grating 36. The output of each photo-detector 39, 40, 41 is dependent on the extent to which the image of the Abbe reference grating 11 coincides with the respective reference grating 36, 37, 38. It should be noted that the arrangement of beams and detectors in FIG. 6 is purely schematic; in practice the optical wedges deflect the different order beams in directions perpendicular to the plane in which they would otherwise lie so that the +ve and −ve orders of each pair have equal path lengths and interfere.

The lateral shift, dX or dY, in the Abbe reference grating 11 caused by a non-zero Abbe arm, AAy or AAx, will be reflected in the image of that grating carried by the different diffraction orders and projected onto reference gratings 36, 37, 38 in the detector 30. The outputs of photo-detectors 39, 40, 41 can therefore be used to determine the Abbe arm AAy or AAx at the position of the Abbe reference grating 11. The Z position of the Abbe reference grating 11 relative to the remainder of the wafer table, and any wafer mounted on it, can be determined using a Z-sensor (level sensor) of known type; see for example WO 99/32940. This information enables the table positioning software to be appropriately calibrated.

The alignment unit 30 is arranged such that when the focal plant of lens system L1 exactly coincides with the Abbe reference grating 11, the image position at the various detectors does not depend on tilt of the Abbe reference grating. However, the alignment unit cannot be properly focused until the Abbe arm is known and the coordinate systems of the positioning and adjustment systems are aligned. Until the detector is focused, the angular dependence on tilt will affect the positions of the images on reference gratings 36, 37, 38 and hence constitutes an error in the signal from which the Abbe arm is determined. However, this error is in fact small, even in the case of the higher diffraction orders. Thus, with the present invention it is possible to make an initial, rapid measurement of the Abbe arm before the detector is focused, and improve it after the detector has been focused.

Light source 21, shown in FIG. 4, may be a separate light source, such as a laser diode, dedicated to the Abbe calibration process, or may be the light source of the alignment system which provides detector 30. In that case, it is necessary to provide a means of selectively routing the illumination light to illuminate the appropriate grating for the function being performed. If the Abbe arm calibration only needs to be performed infrequently, this can be achieved using interchangeable plugs in a fiber connection plate, for example. If more frequent Abbe arm calibration is desired, a conventional beam splitter and shutters, or a mechanically moveable mirror, can be used in combination with collimators to lead the illumination light into and out of fibers used to route the light to illuminate the appropriate grating.

Embodiment 2

Figure 7:
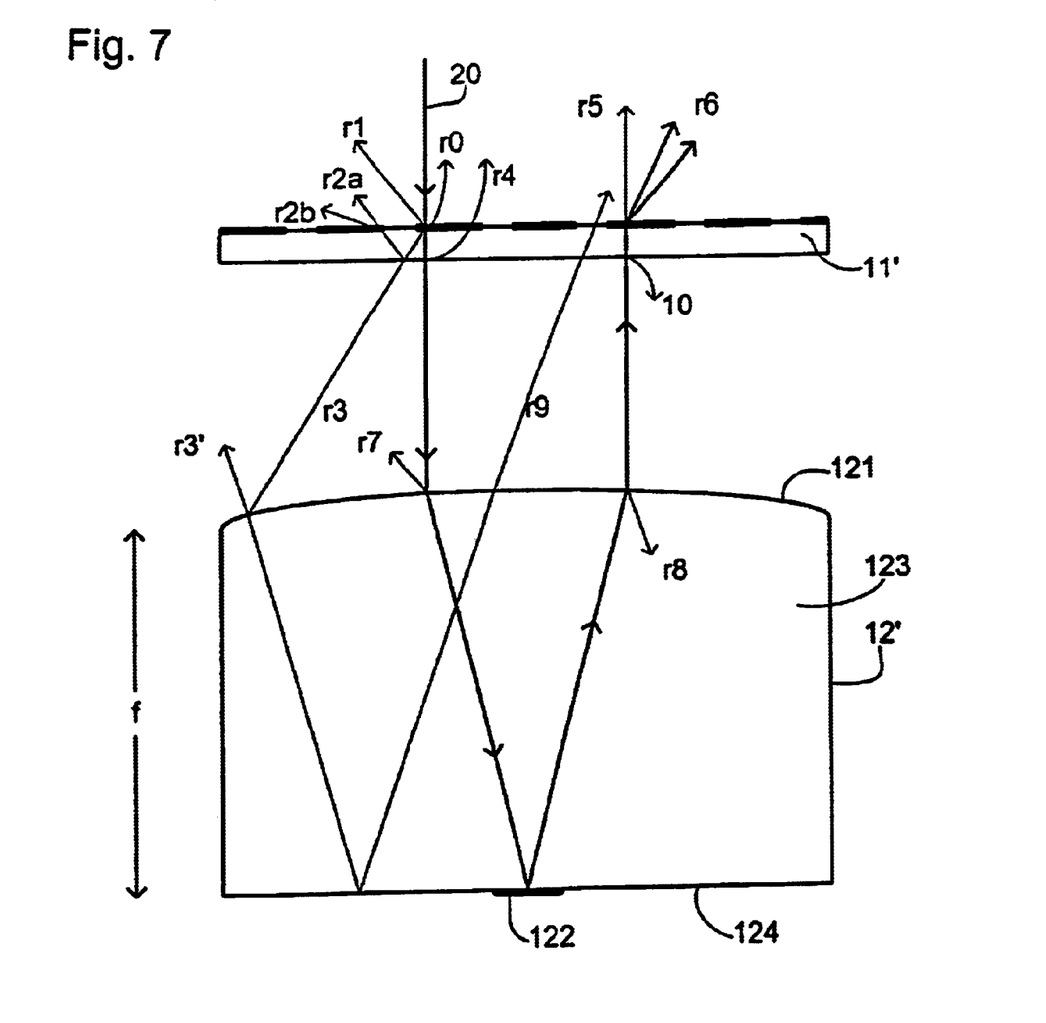
FIG. 7 is a side view of a retro-reflector and grating used in a second embodiment of the invention.

In a second embodiment of the invention, which is similar to the first embodiment save as described below, light guide 12 is replaced by a retro-reflector 12' placed directly behind Abbe reference grating 11'. As shown in FIG. 7, the measurement beam 20 is directed onto the front of Abbe reference grating 11' which, as before, is a transmissive diffraction grating. The zeroth order beam is undiverted and is returned by retro-reflector 12' along a return path parallel to the incident path. The returning beam is again diffracted by Abbe reference grating 11' and the desired diffraction orders collected by detector 30 (not shown in FIG. 7) for measurement of the Abbe arm, as described above.

Retro-reflector 12' may comprise a so-called "cats-eye" which consists of a lens 121 and a mirror 122 placed at a distance from the lens 121 equal to its focal length, f.

Conveniently, the lens 121 is embodied in the curved front surface of a single transparent body 123 which has a plane rear surface that is selectively silvered to form mirror 122.

The elimination of unwanted diffracted and reflected beams is shown in FIG. 7. The first unwanted component comprises reflections from the front surface of Abbe reference grating 11'. These may be direct, r0, or diffracted, r1, and are minimized by the provision of anti-reflection coatings on the front surface of the grating 11'. Next are reflections from the rear surface of the grating 11', either of the diffracted orders, shown as r2a, which may be further diffracted as r2b, or of the zeroth order, as r4. These will be small and again mat be minimized by appropriate anti-reflection coatings. It should be noted that beams r0 and r4 will return along the path of the incident light beam 20 but for clarity they are shown displaced in FIG. 7.

The orders (shown as r3) other than zero, generated on the first transit of the reference grating 11' by the measurement beam 20, will be focused on the rear surface 124 of body 123 by lens 121 and then returned as r9. Reflection of these orders can be minimized by blackening the rear surface 124 outside the silvered area 122 where the desired zeroth order falls. Unwanted reflections, shown as r3', r7 and r8, at the glass-air interface of lens 121 can be avoided by a further anti-reflection coating. The zeroth order at the second transit of the reference grating 11' can be used or blocked by the detector 30, as desired.

Embodiment 3

In a third embodiment, not illustrated, the measurement beam 20 can be provided by a light source (illumination means) fixed to the long stroke drive module of the wafer table. Since wafer table tilt is controlled by the short stroke drive module, the direction of incidence of the measurement beam will still be independent of wafer table tilt. The light source fixed to the long stroke drive module may comprise a laser or other light generator positioned elsewhere, such as that provided in the alignment sensor used for detector 30, and linked by fiber-optics to an emission point fixed to the long stroke drive module. The measurement beam 20 can be directed through the wafer table and illuminate an Abbe arm reference mark from underneath Embodiment 4

A fourth embodiment of the invention (not illustrated) makes use of a light source fixed to the wafer table behind the Abbe reference grating 11. This is advantageous in that the grating is illuminated directly so that the polarization state of the measurement beam can be made clean. Polarization shifts due to phase differences introduced between the p- and s- components on reflection of the measurement beam are avoided. The cleaner polarization state of the measurement beam can improve the accuracy of detector 30. In this embodiment, because the direction of incidence of the measurement beam is not independent of wafer table tilt, the detection measurement made by detector 30 will depend to a greater extent on the Z-position of the focal plane of that detector, so that full calibration of that detector may be necessary to fully determine the Abbe arm.

Embodiment 5

In a fifth embodiment of the invention (not illustrated), Abbe arm calibration is determined using a focused alignment system. The alignment system can be focused by considering the contrast of the alignment signal; when the system is out of focus the contrast will decrease from a maximum at optimum focus. Alternatively the alignment system can be focused by considering the tilt dependency of the alignment signal; when the alignment signal is tilt independent the alignment system is at optimum focus.

Once the alignment sensor has been focused correctly, the Abbe arm can be calibrated by directly measuring lateral displacements of a reference point in a plane of said second object table as a function of wafer table height and tilt. The reference point may take the form of a reference grating mounted on said second object table.

Embodiment 6

In a sixth embodiment (not illustrated), a dedicated exposure apparatus is provided at the measurement position of a twin-stage lithographic apparatus. The dedicated exposure apparatus may be considerably simpler than the main exposure system of the lithographic apparatus as it only needs to expose a relatively small fixed reference pattern. At a minimum, the dedicated exposure apparatus comprises a means for supplying illumination radiation, a fixed reference pattern and a projection system. Preferably the illumination radiation is capable of exposing the same resists as are exposed by the main exposure system, so that the equipment for developing such resists will be on-hand.

While we have described above a specific embodiment of the invention it will be appreciated that the invention may be practiced otherwise than described. The description is not intended to limit the invention.

What is claimed is:

1. A lithographic projection apparatus comprising:
    an illumination system to supply a projection beam of radiation;
    a first object table to hold a projection beam patterning structure capable of patterning the projection beam according to a desired pattern;
    a second object table to hold a substrate having a surface to be exposed, such that, when held on the table, the said surface lies in a reference plane;
    a projection system which images the patterned beam onto a target portion of the substrate;
    a positioning system which moves said second object table between an exposure position, at which said projection system can image said patterned beam onto said substrate, and a measurement position; and
    a calibration system to measure lateral displacements of a reference point in a plane of said second object table as a function of tilt, at said measurement position, wherein said calibration system comprises:
        a diffraction grating mounted to said second object table;
        an illuminator which generates a measurement beam of radiation and directs it to be incident on said diffraction grating so as to be diffracted thereby; and
        a detector which detects the position of said diffraction grating.

2. Apparatus according to claim 1 wherein said diffraction grating is an at least partially transmissive diffraction grating and said calibration system further comprises a light guide which directs said measurement beam to be incident on said diffraction grating in a direction substantially independent of the tilt of said second object table.

3. Apparatus according to claim 1, wherein said calibration system is constructed and arranged to measure displacements of a reference point in said reference plane and said diffraction grating is mounted substantially parallel to said reference plane on said second object table.

4. Apparatus according to claim 2, wherein said illuminating means is arranged to emit said measurement beam along an incident path substantially perpendicular to and spaced from said diffraction grating, and said light guide comprises a plurality of reflectors mounted to said second object table behind said diffraction grating relative to said illuminator and positioned to reflect said measurement beam onto a return path parallel to said incident path and passing through said diffraction grating in a direction opposite to said incident path.

5. Apparatus according to claim 4, wherein said plurality of reflectors comprises a transparent body having three mutually perpendicular faces at which said measurement beam undergoes reflection.

6. Apparatus according to claim 1, wherein said illuminator is arranged to emit said measurement beam along an incident path substantially perpendicular to said diffraction grating and passing therethrough, and comprising a light guide including a retro-reflector mounted to said second object table behind said diffraction grating relative to said illuminator to reflect said measurement beam along a return path substantially parallel to said incident path and passing back through said diffraction grating.

7. Apparatus according to claim 6, wherein said retro-reflector comprises a plane-reflector and a condensing lens mounted at a distance substantially equal to its focal length from said plane-reflector.

8. Apparatus according to claim 7, wherein said retro-reflector comprises a solid body of transparent material having a front surface curved to form said condensing lens and a plane rear surface partly reflective to form said plane-reflector.

9. Apparatus according to claim 7, wherein said plane-reflector is sized and positioned so as to reflect substantially only the zeroth diffraction order of the measurement beam diffracted by its first passage through said diffraction grating.

10. Apparatus according to claim 9, further comprising absorbent or diffusive surfaces in the plane of said plane-reflector outside the reflecting area thereof.

11. Apparatus according to claim 6, wherein said retro-reflector comprises a corner-cube.

12. Apparatus according to claim 6 further comprising an anti-reflection coating on at least one surface of said diffraction grating.

13. Apparatus according to claim 1 comprising a plurality of calibration systems for measuring displacements of said second object table with tilt about a plurality of axes.

14. A method of calibrating a lithographic projection apparatus comprising:
    measuring a position of a reference point on a surface of an object table for holding a substrate having a surface to be exposed at different tilts;
    calculating a distance between the surface of the object table and a rotation-invariant point of the object table; and
    adjusting parameters of an electronic controller included in a positioning system for moving said object table between an exposure position and a measurement position so that said rotation-invariant point is at a predetermined vertical distance from the reference point of the object table.

15. A method of manufacturing a device using a lithographic projection apparatus comprising:
    providing a substrate provided with a radiation-sensitive layer and having target portions thereof to an object table;
    providing a projection beam of radiation using an illumination system;
    using a projection beam patterning structure to endow the projection beam with a pattern in its cross section;
    moving the object table to an exposure position;

projecting the patterned beam of radiation onto said target portions of the substrate; and detecting displacements of a reference point of said object table at various angles of tilt when situated at a measurement position.

16. A device manufactured according to the method of claim 15.

17. An apparatus according to claim 14, wherein measuring of the position of the reference point on the surface of the object table comprises directing a measurement beam to be incident on a diffraction grating, provided on the object table, substantially independent of the tilt of the object table and detecting the position of said diffraction grating.

18. An apparatus according to claim 14, wherein measuring of the position of the reference point on the surface of the object table comprises directing a measurement beam along an incident path substantially perpendicular to a diffraction grating provided on the object table, and reflecting said measurement beam along a return path substantially parallel to the incident path and passing through said diffraction grating in a direction opposite to the incident path.

19. An apparatus according to claim 15, wherein detecting displacements of the reference point of said object table comprises directing a measurement beam to be incident on a diffraction grating, provided on said object table, substantially independent of the tilt of said object table and detecting the position of said diffraction grating.

20. An apparatus according to claim 15, wherein detecting displacements of the reference point of said object table comprises directing a measurement beam along an incident path substantially perpendicular to a diffraction grating provided on said object table, and reflecting said measurement beam along a return path substantially parallel to the incident path and passing through said diffraction grating in a direction opposite to the incident path.

* * * * *